United States Patent [19]
Liao et al.

[11] Patent Number: 6,075,255
[45] Date of Patent: Jun. 13, 2000

[54] CONTACTOR SYSTEM FOR A BALL GRID ARRAY DEVICE

[75] Inventors: Mu-Sheng Liao, Chu-Pei; Lai-Fue Hsieh; Yi-Chang Hsieh, both of Hsin-Chu, all of Taiwan

[73] Assignee: Silicon Integrated Systems Company, Hsin-Chu, Switzerland

[21] Appl. No.: 09/152,724

[22] Filed: Sep. 14, 1998

[51] Int. Cl.$^7$ .................... H01L 23/58; H01L 21/461; H01L 21/469
[52] U.S. Cl. .............. 257/48; 257/48; 257/727; 257/738; 257/747; 257/778; 361/759; 361/801
[58] Field of Search .............. 257/48, 727, 738, 257/747, 668, 692, 698, 778; 438/14, 18; 361/740, 759, 801

[56] References Cited

U.S. PATENT DOCUMENTS

| | | | |
|---|---|---|---|
| 5,570,033 | 10/1996 | Staab | 324/761 |
| 5,578,870 | 11/1996 | Farnsworth et al. | 257/727 |
| 5,646,447 | 7/1997 | Ramsey et al. | 257/727 |
| 5,688,127 | 11/1997 | Staab et al. | 439/66 |
| 5,892,245 | 4/1999 | Hilton | 257/48 |
| 5,932,891 | 8/1999 | Higashi et al. | 257/48 |

*Primary Examiner*—Minh Loan Tran
*Assistant Examiner*—Cuong Quang Nguyen
*Attorney, Agent, or Firm*—Ladas & Parry

[57] ABSTRACT

A contactor system is adapted for use when testing a ball grid array (BGA) device, and includes a conductive socket that is retained on a testing board and that establishes a ground connection therewith. The socket is formed with a receiving space adapted for receiving the BGA device therein. An insulating guide unit is mounted on the socket in the receiving space and is adapted to guide loading movement of the BGA device into the receiving space via an open top section of the latter and to prevent undesired electrical contact between the socket and the BGA device. A surface mount matrix is disposed on top of the testing board and is clamped between the socket and the testing board. The surface mount matrix is accessible via an open bottom section of the receiving space, and is adapted to contact solder balls on the BGA device directly so as to establish electrical connection between the BGA device and testing circuit layout on the testing board.

3 Claims, 3 Drawing Sheets

CONTACTOR SYSTEM FOR A BALL GRID ARRAY DEVICE

BACKGROUND OF THE INVENTION

1. Field of the Invention

The invention relates to ball grid array (BGA) devices, more particularly to a contactor system adapted for use when testing BGA devices.

2. Description of the Related Art

Ball grid array (BGA) packages are high pin count integrated circuit packages that are widely used in surface mounting applications. Referring to FIG. 1, a known BGA device 1 includes a semiconductor device disposed on a dielectric insulating substrate 11 that is formed with circuit traces (not shown) for electrical connection with the semiconductor device 10. An array of solder balls 12 that are formed from tin is provided on a bottom surface of the insulating substrate 11 and is connected electrically to the circuit traces to serve as electrical contacts for the BGA device 1. In the mass production of BGA devices 1, a number of insulating substrates 11 are initially interconnected to form a large insulating block. After the circuit traces are formed, the insulating block is subsequently cut to form the individual insulating substrates 11, thereby resulting in exposed conductive contacts on the periphery of each insulating substrate 11.

BGA devices 1 are usually tested for defects during the production stage. FIGS. 2 and 3 illustrate a known contactor system 2 suitable for testing BGA devices 1. The contactor system 2 includes a testing board 20 provided with a testing circuit layout that is connected to a testing apparatus (not shown), and a socket 21 formed from an insulator material and retained on the testing board 20 via a mounting seat 24 that is fixed on the testing board 20. The socket 21 is formed with a receiving space 210 that opens upwardly. Guide members 211 project inwardly from the socket 21 into the receiving space 210. The socket 21 has a contactor plate 212 disposed at a bottom end of the receiving space 210 and formed with a plurality of apertures 213 that are registered with the solder balls 12 of the BGA device 1 that is to be tested. Spring probes or pogo pins 22 are received in the apertures 213. A surface mount matrix 23 is clamped between the contactor plate 212 and the testing board 20. The surface mount matrix 23 interconnects the pogo pins 22 and the testing circuit layout on the testing board 20. The pogo pins 22, in turn, interconnect the BGA device 1 and the surface mount matrix 23.

When testing the BGA device 1 for defects, the BGA device 1 is loaded into the receiving space 210 cf the socket 21 via the open top of the latter so as to enable the solder balls 12 to contact the pogo pins 22. The guide members 211 facilitate proper positioning of the BGA device 1 in the receiving space 210. The BGA device 1 is then pressed toward the pogo pins 22 to ensure electrical connection between the BGA device 1 and the testing circuit layout on the testing board 20 via the pogo pins 22 and the surface mount matrix 23.

Some of the drawbacks of the conventional contactor system 2 described beforehand are as follows:

1. When the BGA device 1 is pressed toward the pogo pins 22, scratching of the surface of the solder balls 12 by the pogo pins 22 is likely to occur. The solder material removed from one of the solder balls 12 can get trapped between an adjacent pair of the solder balls 12 and can result in short-circuiting, thereby leading to damage to the BGA device 1 and in a lower production yield.

2. As mentioned beforehand, exposed conductive contacts are present on the periphery of the insulating substrate 11 of the BGA device 1. After the BGA device 1 has been tested for defects and is removed from the socket 21, static electricity of as high as 600 to 800 volts is usually observed between the guide members 211 in the receiving space 210 and the exposed conductive contacts on the BGA device 1. The static electricity is discharged via the BGA device 1 since the socket 21 is made entirely from an insulator material, and can result in damage to the BGA device 1, which usually breaks down when subjected to a static electricity discharge of about 200 to 300 volts.

3. Due to the lengths of the pogo pins 22, the BGA device 1 experiences loss during high frequency testing.

SUMMARY OF THE INVENTION

Therefore, the main object of the present invention is to provide a contactor system for a BGA device that can avoid scratching of the solder balls when testing the BGA device for defects.

Another object of the present invention is to provide a contactor system for a BGA device that can reduce the amount of static electricity discharge that is experienced by the BGA device when the latter is removed after testing.

A further object of the present invention is to provide a contactor system for a BGA device in which losses during high frequency testing can be minimized.

Accordingly, the contactor system of the present invention is adapted for use when testing a ball grid array (BGA) device having a bottom surface formed with an array of solder balls. The contactor system comprises a testing board, a conductive socket, an insulating guide unit, and a surface mount matrix. The testing board is provided with a testing circuit layout. The conductive socket is retained on the testing board and establishes a ground connection therewith. The socket is formed with a receiving space adapted for receiving the BGA device therein. The receiving space has open top and bottom sections. The insulating guide unit is mounted on the socket in the receiving space and is adapted to guide loading movement of the BGA device into the receiving space via the open top section and to prevent undesired electrical contact between the socket and the BGA device. The surface mount matrix is disposed on top of the testing board and is clamped between the socket and the testing board. The surface mount matrix is accessible via the open bottom section of the receiving space and is adapted to contact the solder balls on the BGA device directly so as to establish electrical connection between the BGA device and the testing circuit layout on the testing board. Preferably, the socket is formed with a plurality of fastening projections that project inwardly into the open top section of the receiving space. The guide unit includes a plurality of guide blocks, each of which is fastened to a lower side of a respective one of the fastening projections.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
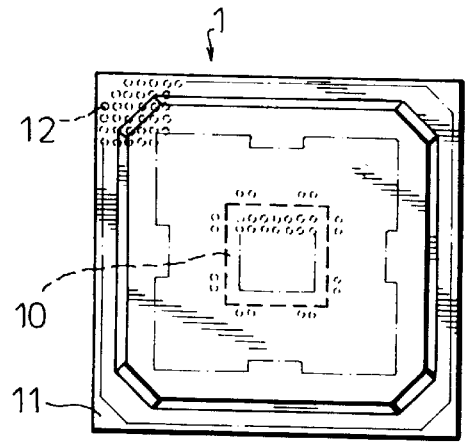
FIG. 1 is a schematic top view of a conventional BGA device.
Figure 2:
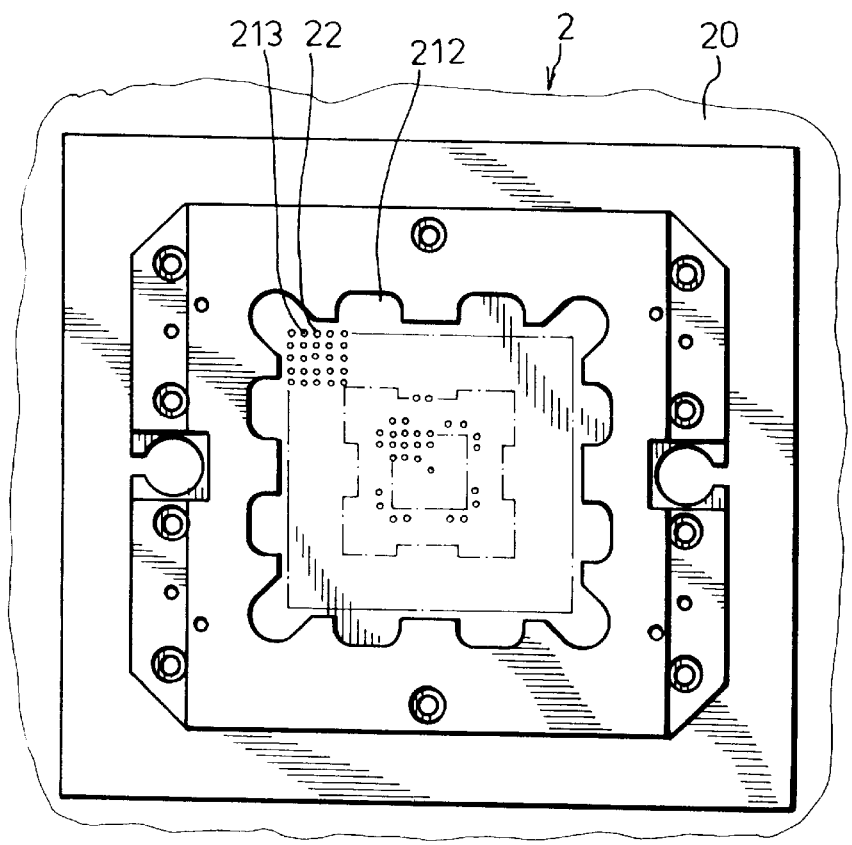
FIG. 2 is a schematic top view of a conventional contactor system for a BGA device.
Figure 3:
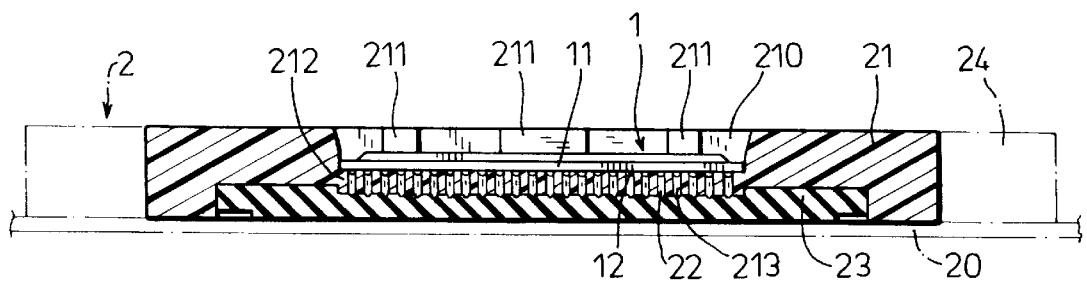
FIG. 3 is a schematic sectional view of the conventional contactor system.
Figure 4:
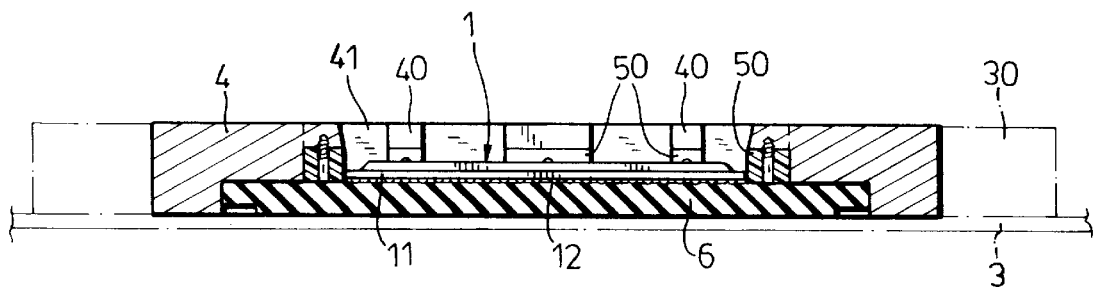
FIG. 4 is a schematic sectional view of the preferred embodiment of a contactor system for a BGA device according to the present invention.
Figure 5:
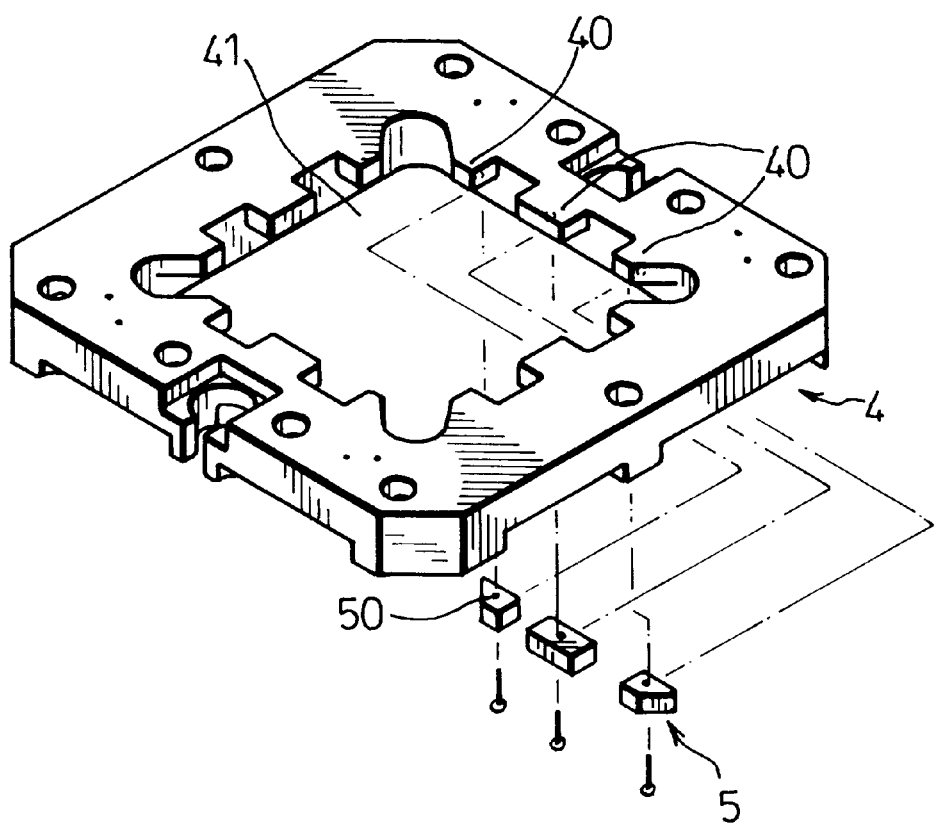
FIG. 5 is a fragmentary exploded perspective view of the preferred embodiment.

Referring to FIGS. 4 and 5, the preferred embodiment of a contactor system according to the present invention is shown to be adapted for use with the conventional BGA device 1 described beforehand. The contactor system comprises a testing board 3, a conductive socket 4, an insulating guide unit 5 and a surface mount matrix 6.

The testing board 3 is provided with a testing circuit layout that is connected to a testing apparatus (not shown), and has a conductive mounting seat 30 fixed thereon.

The socket 4 is retained on the testing board 3 via the mounting seat 30. A ground connection is thus established between the socket 4 and the testing board 3 via the mounting seat 30. The socket 4 is formed with a central receiving space 41 that has open top and bottom sections. Fastening projections 40 project inwardly from the socket 4 into the open top section of the receiving space 41.

The guide unit 5 includes a plurality of guide blocks 50 that are fastened respectively to lower sides of the fastening projections 40 by means of screws.

The surface mount matrix 6 is disposed on top of the testing board 3 and is clamped between the socket 4 and the testing board 3. The surface mount matrix 6 is accessible via the open bottom section of the receiving space 41, and is adapted to contact the solder balls 12 on the BGA device 1 directly so as to establish electrical connection between the BGA device 1 and the testing circuit layout on the testing board 3.

When testing the BGA device 1 for defects, the BGA device 1 is loaded into the receiving space 41 of the socket 4 so as to enable the solder balls 12 to contact the surface mount matrix 6. The guide blocks 50 guide loading movement of the BGA device 1 into the receiving space 41 via the open top section of the latter so as to position the BGA device 1 properly in the receiving space 41. The guide blocks 50 further prevent undesired electrical contact between the socket 4 and the exposed conductive contacts on the periphery of the insulating substrate 11 of the BGA device 1. The BGA device 1 is then pressed toward the surface mount matrix 6 to ensure electrical connection between the BGA device 1 and the testing circuit layout on the testing board 3 via the surface mount matrix 6.

Some of the advantages of the contactor system of this invention are as follows:

1. Because the BGA device 1 is indirect contact with the surface mount matrix 6, the solder balls 12 are not scratched when the BGA device 1 is pressed toward the surface mount matrix 6. Thus, short-circuiting among the solder balls 12 can be avoided during the testing stage.

2. Because the socket 4 is made of a conductive material, after the BGA device 1 has been tested for defects and is removed from the socket 4, a large part of the static electricity between the insulating guide blocks 50 in the receiving space 41 and the exposed conductive contacts on the BGA device 1 can be discharged to the ground via the fastening projections 40 on the socket 4 and the testing board 3. It has been observed that the static electricity that is discharged via the BGA device 1 when the present invention is in use is below 80 volts, which is much less than the 200 to 300 volt static electricity discharge that can damage the BGA device 1.

3. Because the BGA device 1 is in direct contact with the surface mount matrix 6, no loss is experienced during high frequency testing.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

I claim:

1. A contactor system adapted for use when testing a ball grid array (BGA) device, the BGA device having a bottom surface formed with an array of solder balls, said contactor system comprising:

a testing board provided with a testing circuit layout;

a conductive socket retained on said testing board and establishing a ground connection therewith, said socket being formed with a receiving space adapted for receiving the BGA device therein, said receiving space having open top and bottom sections;

an insulating guide unit mounted on said socket in said receiving space and adapted to guide loading movement of the BGA device into said receiving space via said open top section and to prevent undesired electrical contact between said socket and the BGA device; and a surface mount matrix disposed on top of said testing board and clamped between said socket and said testing board, said surface mount matrix being accessible via said open bottom section of said receiving space and being adapted to contact the solder balls on the BGA device directly so as to establish electrical connection between the BGA device and said testing circuit layout on said testing board.

2. The contactor system as claimed in claim 1, wherein said socket is formed with a plurality of fastening projections that project inwardly into said open top section of said receiving space, said guide unit being mounted on said fastening projections.

3. The contactor system as claimed in claim 2, wherein said guide unit includes a plurality of guide blocks, each of which is fastened to a lower side of a respective one of said fastening projections.

* * * * *

UNITED STATES PATENT AND TRADEMARK OFFICE
CERTIFICATE OF CORRECTION

PATENT NO. : 6,075,255
DATED : June 13, 2000
INVENTOR(S) : Liao et al.

Page 1 of 1

It is certified that error appears in the above-identified patent and that said Letters Patent is hereby corrected as shown below:

Title page
Item, [73], "Switzerland" should read -- Taiwan, Republic of China --

Signed and Sealed this

Twenty-eighth Day of August, 2001

Attest:

*Nicholas P. Godici*

NICHOLAS P. GODICI
*Attesting Officer*
*Acting Director of the United States Patent and Trademark Office*